US008148192B2

(12) United States Patent  (10) Patent No.: US 8,148,192 B2
Campbell et al.  (45) Date of Patent: Apr. 3, 2012

(54) TRANSPARENT SOLAR CELL METHOD OF FABRICATION VIA FLOAT GLASS PROCESS

(76) Inventors: James P Campbell, Menlo Park, CA (US); Harry R Campbell, Los Gatos, CA (US); Ann B Campbell, Los Gatos, CA (US); Joel F Farber, San Jose, CA (US)

( * ) Notice: Subject to any disclaimer, the term of this patent is extended or adjusted under 35 U.S.C. 154(b) by 202 days.

(21) Appl. No.: 12/709,513

(22) Filed: Feb. 22, 2010

(65) Prior Publication Data
US 2011/0203660 A1   Aug. 25, 2011

(51) Int. Cl.
*H01L 21/00* (2006.01)
(52) U.S. Cl. .............. 438/94; 438/57; 438/87; 438/476; 438/796; 438/920; 257/E27.125; 257/E31.126
(58) Field of Classification Search .............. 438/57, 438/87, 94, 95, 476, 796, 920; 257/E27.125, 257/E31.126
See application file for complete search history.

(56) References Cited

U.S. PATENT DOCUMENTS

| | | | |
|---|---|---|---|
| 4,824,489 A | 4/1989 | Cogan et al. | |
| 5,192,991 A | 3/1993 | Hosokawa | |
| 5,413,959 A | 5/1995 | Yamamoto et al. | |
| 5,578,502 A * | 11/1996 | Albright et al. | 438/95 |
| 5,667,597 A | 9/1997 | Ishihara | |
| 5,677,240 A | 10/1997 | Murakami et al. | |
| 5,714,404 A | 2/1998 | Mitlitsky et al. | |
| 5,886,688 A | 3/1999 | Fifield et al. | |
| 6,180,871 B1 | 1/2001 | Campbell et al. | |
| 6,320,117 B1 | 11/2001 | Campbell et al. | |
| 6,509,204 B2 | 1/2003 | Campbell | |
| 7,091,411 B2 | 8/2006 | Falk et al. | |
| 7,498,058 B2 | 3/2009 | Harris et al. | |
| 7,592,198 B2 | 9/2009 | Huet et al. | |
| 2006/0065299 A1 | 3/2006 | Fukawa et al. | |
| 2008/0053518 A1 | 3/2008 | Chang et al. | |
| 2009/0025791 A1 | 1/2009 | Matsui | |
| 2009/0165849 A1 | 7/2009 | Chan et al. | |
| 2010/0255627 A1 * | 10/2010 | Cording et al. | 438/62 |

* cited by examiner

*Primary Examiner* — Jarrett Stark
*Assistant Examiner* — John M Parker

(57) ABSTRACT

The present invention provides improved devices such as transparent solar cells. This patent teaches a particularly efficient method of device manufacture based on incorporating the solar cell fabrication into the widely used, high temperature, Float Glass manufacture process.

9 Claims, 3 Drawing Sheets

TRANSPARENT SOLAR CELL METHOD OF FABRICATION VIA FLOAT GLASS PROCESS

BACKGROUND OF THE INVENTION

The present invention relates, in general, to electronic devices. More particularly, the present invention provides a transparent solar cell and optical filter formed with a PIN diode or NIP diode and method of its manufacture.

Solar energy provides many advantages over traditional energy sources. Many different applications benefit greatly from the use of solar energy. For example, buildings and automobiles with their broad surfaces that are exposed to the sun's energy for much of the day can use that energy to provide some or all of their energy needs. Various solar cells have been developed using different fabrication techniques to take advantage of this energy source, most are expensive and not transparent.

One of the inventors of the present invention has previously filed patent applications directed toward a solar cell. Those patent applications describe a structure that includes a p-n junction diode. The p+ and n− polycrystalline silicon structures making up the PIN junction are formed using an Excimer laser. An advantage of using the Excimer laser is that it may form the polycrystalline silicon without destroying a low melting point substrate upon which the solar cell is fabricated. This patent teaches a particularly efficient method of device manufacture based on incorporating the solar cell fabrication into the widely used, high temperature, Float Glass manufacture process.

BACKGROUND ON THE FLOAT GLASS PROCESS

The flat glass industry and its primary products are classified under Standard Industrial Classification (SIC) 3211. Among the products included are flat building glass, cathedral glass, float glass, antique glass, sealed insulating glass units, laminated glass made from glass produced in the same establishments, picture glass, plate glass (rough or polished), skylight glass, flat structural glass, tempered glass, window glass, etc.

There are three basic types of flat glass; sheet, plate, and float. The principal distinction between these types of glass is how they are made, since the manufacturing processes used in producing them are very different.

In the Float Glass process, glass is melted in very large side port furnaces, and the exiting molten glass is "poured" onto a pool of molten tin. A continuous ribbon of glass is then drawn from this spreading mass. This process has the advantage of pushing the refractory contaminated glass to the outside of the ribbon; it is later scraped. The process has now been developed to provide any thickness glass between 2 and 20 millimeters.

This continuous flow process may be augmented to produce the devices described in this patent, while the glass is still hot.

PRIOR ART

The prior art includes other types of solar cells with P-N junctions. One type of solar cell is formed with crystalline silicon. For these solar cells, crystalline silicon is formed by melting silicon and drawing an ingot of crystalline silicon of the size desired. Alternatively, a ribbon of crystalline silicon can be pulled from molten silicon to form a crystalline silicon solar cell. A conductor is placed on either side of the crystalline silicon to form the solar cell. These processes use high temperatures and the solar cells are expensive to manufacture. Packaging is also difficult and expensive and creates a rigid structure. Their maximum size is limited by the manufacturing process. It is difficult to slice the resulting crystalline silicon thin enough to provide a transparent or flexible solar cell. However, these structures are very efficient (relative to other types of presently available commercial solar cells). As such, crystalline solar cells are used primarily for applications where efficiency is more important than cost and where the structures do not need to be flexible. For example, these are commonly used on satellites.

Another type of solar cell is formed with polycrystalline silicon. These may be formed as thin layers on wafers and can thus be made thinner than crystalline silicon solar cells. As is well known in the art, polycrystalline silicon can be formed by heating amorphous silicon and allowing it to cool. Typically, amorphous silicon begins to crystallize after it melts at temperatures greater than about 1400° C. and begins to cool below that level. Because of these high temperatures, known processes can only use substrates with high melting points. These processes are not appropriate for substrates made of plastics or other materials that melt at lower temperatures. In the manufacture of flat panel displays, it is known to use lasers to form polycrystalline silicon thin film transistors (TFTs). Such use has not included the formation of P-N junctions or solar cells which presents its own set of challenges. Moreover, these manufacturing processes generally formed single transistors and were not used to form large sheets or areas of polycrystalline silicon, the solar cells.

Another type of solar cell has been formed using doped layers of amorphous silicon. These are not subject to some of the problems inherent in the previously described crystalline silicon or polycrystalline solar cells. First, amorphous silicon can be formed using low temperature processes. Thus, it can be formed on plastic and other flexible substrates. They can also be formed over large surfaces. Second, the processing techniques are less expensive. Nevertheless, amorphous solar cells introduce other significant limitations not found in crystalline silicon or polycrystalline silicon solar cells. For example, hydrogen is generally added during the manufacturing to increase the efficiency of the cell. Amorphous silicon solar cells tend however to lose this hydrogen over time, causing reduced efficiency and reduced usable life. Moreover, amorphous silicon solar cells are not transparent. Thus, they are not appropriate for many applications. For example, buildings and cars with solar cells can be unsightly, and the solar panels may block the view of the outdoors or access to outside light indoors. Also, portable electronics often place a premium on size and surface area. Some devices have displays that cover most—if not all—of the exposed surface of the device. Therefore, it is often undesirable or impossible to mount a traditional amorphous silicon solar cell on the device.

Attempts have been made to solve this transparency problem by making transparent panels from existing solar cell processes. One method has been to take advantage of the "window shade effect" whereby solar cells are formed on a transparent substrate with gaps between adjacent solar cells. This allows some light to pass through to create a transparent effect. The larger the gaps, the more transparency the device has. A disadvantage of this technique is that much of the space is unused; therefore the efficiency of the device is less than it would be if all of the surface area was used for solar cells. Of course, devices of this type also suffer from the problems inherent to the type of cell used. For example, if based on amorphous silicon, these devices suffer from the hydrogen loss exhibited in other amorphous silicon devices.

Other work has been done at making transparent solar cells using materials other than silicon (for example, cadmium telluride (CdTe)). These cells suffer from the challenges inherit to using materials other than silicon.

We characterize the prior art into three groups. We see the window shade/holes approach described above. Second, we see art where the conductive interior layers are transparent, but not the entire device. Third, we see prior generations of devices based on amorphous silicon as the main material. The device and method of manufacture presented here characterize a novel approach very different than the prior art.

SUMMARY OF THE INVENTION

The present invention provides for improved devices such as transparent solar cells and optical filters. It also provides significantly improved methods for forming those devices. The objective is to produce transparent solar cells for use on buildings as windows, car windows and other uses that do not block the view of the outdoors or access to outside light indoors. In contrast with devices and methods previously disclosed by one of the present inventors, these improved devices and methods use fewer thinner layers resulting in simpler, much less expensive fabrication processes and resulting in simpler devices along with other beneficial results. Moreover, compared with other fabrication techniques, the present invention allows for the fabrication of devices that are transparent using existing fabrication equipment and processing steps, while allowing those processes to be done quickly and in a less costly manner.

Thus, a new solar cell and method of fabrication that will avoid these problems and is more efficient to manufacture is desirable. Incorporating the solar device fabrication into the Float Glass process, while the glass is in a hot and in a 'plastic state', prevents damage to the substrate and reduces problems that would otherwise be encountered maintaining a smooth substrate surface. Another desirable characteristic of the float glass process is that it provides a slow moving continuous flow substrate for device fabrication. Fabricating while the glass is already hot also further reduces the total energy required to produce a solar cell and thus reduces its cost.

In a first embodiment of the present invention, a method is provided for fabricating a transparent or semi-transparent device. The method may be incorporated in the existing and well known Float Glass process. The method comprises forming a first conductive layer overlying a glass substrate, forming a first dopant-silicon layer overlying the first conductive layer; then forming a second dopant-silicon layer (of opposite dopant type) overlying the first dopant-silicon layer; and converting the silicon layers into polycrystalline silicon by application of thermal energy. Xenon flash lamps or similar devices may be used for applying the thermal energy. Each dopant type and silicon may be premixed and applied together as a single step.

The methodology produces a P-N or N-P diode junction between the conductive layers. The resulting device may be used as a solar cell and an optical filter. Steps of the methodology may be repeated to create successive layers of conductors and polycrystalline silicon. Additional coatings may be applied to engineer the light transmission to fit the application requirements. A further understanding of the nature and advantages of the inventions presented herein may be realized by reference to the remaining portions of the specification and the attached drawings.

DESCRIPTION OF THE SPECIFIC EMBODIMENTS

Figure 1:
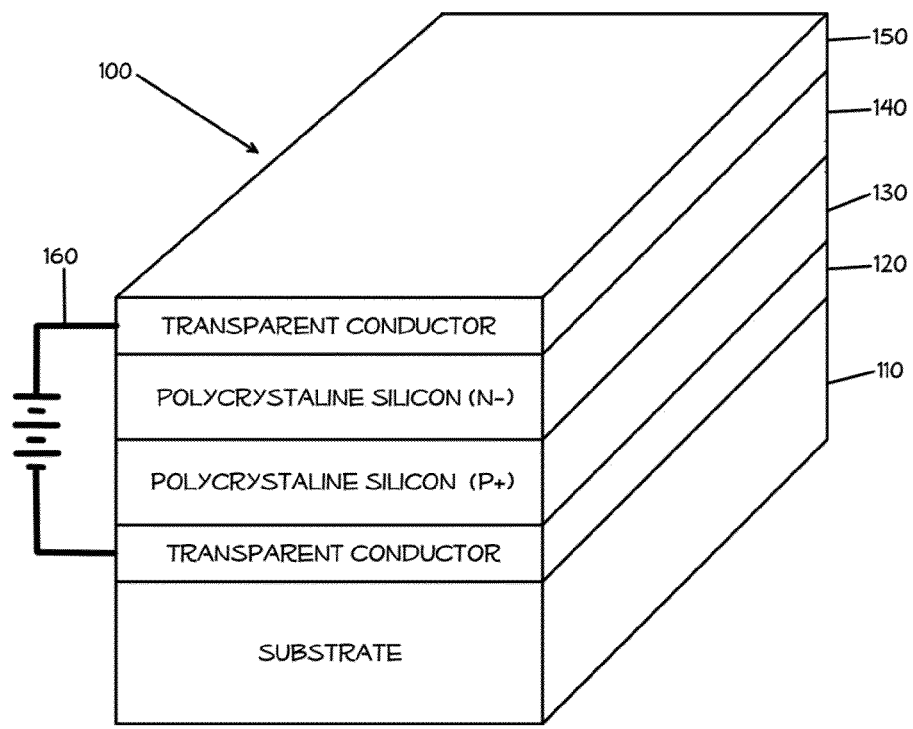
FIG. 1 is a cross-sectional diagram of a transparent solar cell according to the present invention.

FIG. 1 is a cross-sectional diagram of one embodiment of a solar cell 100 according to the present invention. While referred to generically herein as a solar cell, solar cell 100 also may operate efficiently as an optical filter. It may be used as a solar cell and optical filter, or an optical filter exclusively.

In contrast to existing amorphous silicon solar cells, solar cell 100 is transparent or semi-transparent. In this context, transparency is defined as having the property of transmitting light without appreciable scattering so that bodies lying beyond are seen clearly. In the specific embodiment, the reflective component is low; however, the amount of reflection is controllable as will be discussed in more detail below.

Solar cell 100 has a substrate layer 110 providing a base structure for the device. Substrate layer 110 may be glass which is treated during the Float Glass process while the glass is still hot. A first conductive layer 120 overlies the substrate 110. A P-N junction overlies the first conductive layer 120. The P-N junction is formed by a p+ doped transparent polycrystalline silicon layer 130 and an n- doped transparent polycrystalline silicon layer 140. In other embodiments (not shown), the order is reversed and p+ polycrystalline silicon layer 130 is formed above n- polycrystalline layer 140. The p+doped polycrystalline silicon layer 130 and the n- doped polycrystalline silicon layer 140 may obtain their transparency by virtue of their method of fabrication as will be described in detail below. A second conductive layer 150 resides above the P-N junction. 160 depicts external electrical connection.

Because of its transparent nature, solar cell 100 can be used in applications where common float glass is otherwise used. For example, it can be used as window glass on buildings or automobiles or covering on buildings, while maintaining the aesthetics and functionality of glass. Such a window can absorb some of the photons from sunlight or other light sources to produce electricity, while allowing those photons not absorbed to pass through to the other side. Thus, the view through the window is not effectively blocked. While this is a list of some of its applications, it is of course not exhaustive. One can readily identify many applications in which transparent solar cell 100 might be used to generate electricity while not obscuring in any significant degree, the view of the user.

In another embodiment of the present invention, solar cell 100 may operate effectively as an optical filter. In yet another embodiment, it may operate as both a solar cell and an optical filter. It filters out light in undesirable frequencies, while allowing other light selectively to pass through. While it is referred to herein generically as solar cell 100, it is specifically intended that the device include its usage as an optical filter as well.

While a specific embodiment has been described herein, it will be recognized that the present invention is not limited to the specific embodiment described. For example, the p+ and n- layers 130 and 140 may be reversed. Also, different or new fabrication techniques may be used or other changes made that do not depart from the spirit and scope of the present invention. The invention is intended to be limited only by the attached claims.

Figure 2:
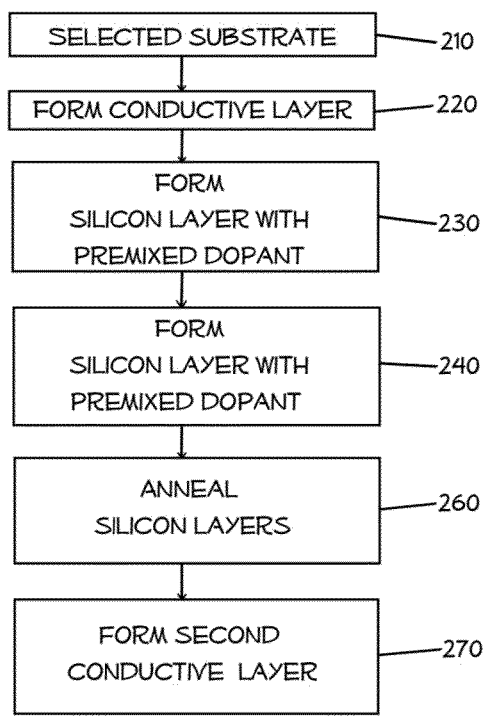
FIG. 2 is a flow diagram showing a method of fabricating solar cells according to the present invention.

FIG. 2 shows a flow diagram of a method of fabricating solar cell 100 according to the present invention. While FIG. 2 shows a specific embodiment, it is not intended that this be the only way such a transparent solar cell may be fabricated. One of skill in the art will recognize that other variations of the invention are readily apparent from the specific embodiment described herein.

Referring to the flow diagram of FIG. 2, in step 210 a suitable substrate 110 is provided upon which solar cell 100 may be fabricated. In this embodiment the substrate is float glass. Significantly, glass during the float glass manufacturing process allows the heat required to crystallize amorphous silicon to be applied without damaging the glass substrate, due to the molten or plastic state of the glass. One of skill in the art will recognize many acceptable materials which can be heated to temperatures about 600 to 800 degrees centigrade or more for substrate 110 and any may be used without departing from the present invention. The selection of substrate 110 is arbitrary except to the extent that transparent or non-transparent structure is more appropriate for the end use of solar cell 100. Depending upon the embodiment, substrate 110 may also be coated with a variety of materials.

In step 220, a first conductive layer 120 is formed on substrate 110. In the specific embodiment, conductive layer 120 is copper (Cu) deposited by sputtering vacuum deposition (SVD) over the entire substrate 110. Other materials for conductive layer 120 may include molybdenum, tungsten, etc. The specific embodiment has a copper thickness below a micron over the area of interest 110; however, other thicknesses may be appropriate for different applications and materials. Its thickness is a function of the desired amount of transparency and conductivity. Depending on the method of deposition an annealing step may be required. Conductive layer 120 may also be deposited or formed in other ways besides SVD. First conductive layer 120 may be a single layer or multiple layers, depending upon the embodiment.

In step 230, a first doped amorphous silicon layer 130 is formed by chemical vapor deposition(CVD) or other deposition method overlying the region of interest with the exception of 2 to 3 cm strips at each edge of conductive layer 120. In the specific embodiment, amorphous silicon layer 130 is a p-type material. It is doped by pre-mixing amorphous silicon with boron or other p-type dopant prior to forming the layer. The concentration of boron or other p-type dopant is such that is commonly used for producing solar cells. First amorphous silicon layer 130 preferably has a thickness of about 1 to 4 microns in the specific embodiment.

In step 240, a second doped amorphous silicon layer 140 is formed by chemical vapor deposition(CVD) or other deposition method overlying the region of interest with the exception of 2 to 3 cm strips at each edge. In the specific embodiment, amorphous silicon layer 140 is an n-type material. It is doped by pre-mixing amorphous silicon with an n-type dopant material such as phosphorus or other n-type dopant prior to forming the layer. The concentration of phosphorus or other n-type dopant is such that is commonly used for producing solar cells. Second amorphous silicon layer 140 preferably has a thickness of about 1 to 4 microns in the specific embodiment.

In step 260, amorphous silicon layer 140 and amorphous silicon layer 130 are annealed using rapid thermal annealing (xenon flash lamps or other adequate heat source). This results in a transparent polycrystalline structure, composed of 130 and 140 creating a P-N junction.

In step 270, a second conductive layer 150 is formed above the P-N junction resulting in solar device 100 as shown in FIG. 1. In the specific embodiment, the second conductive layer is copper or other suitable conductor (molybdenum, or Indium Tin Oxide (ITO)). Conductive layer 150 is deposited with sputtering, CVD, or other method of deposition at a thickness of less than one micron over the area with the exception of 2 to 3 cm strips at each edge of the glass. Its maximum thickness is dependent upon the materials used, desired transparency and conductivity.

An advantage of solar cell 100 is that it does not depend on hydrogen as a carrier, so it does not suffer from the efficiency loss that amorphous silicon does. Thus, its lifetime is extended over that of amorphous solar cells and its efficiency is superior.

Figure 3:
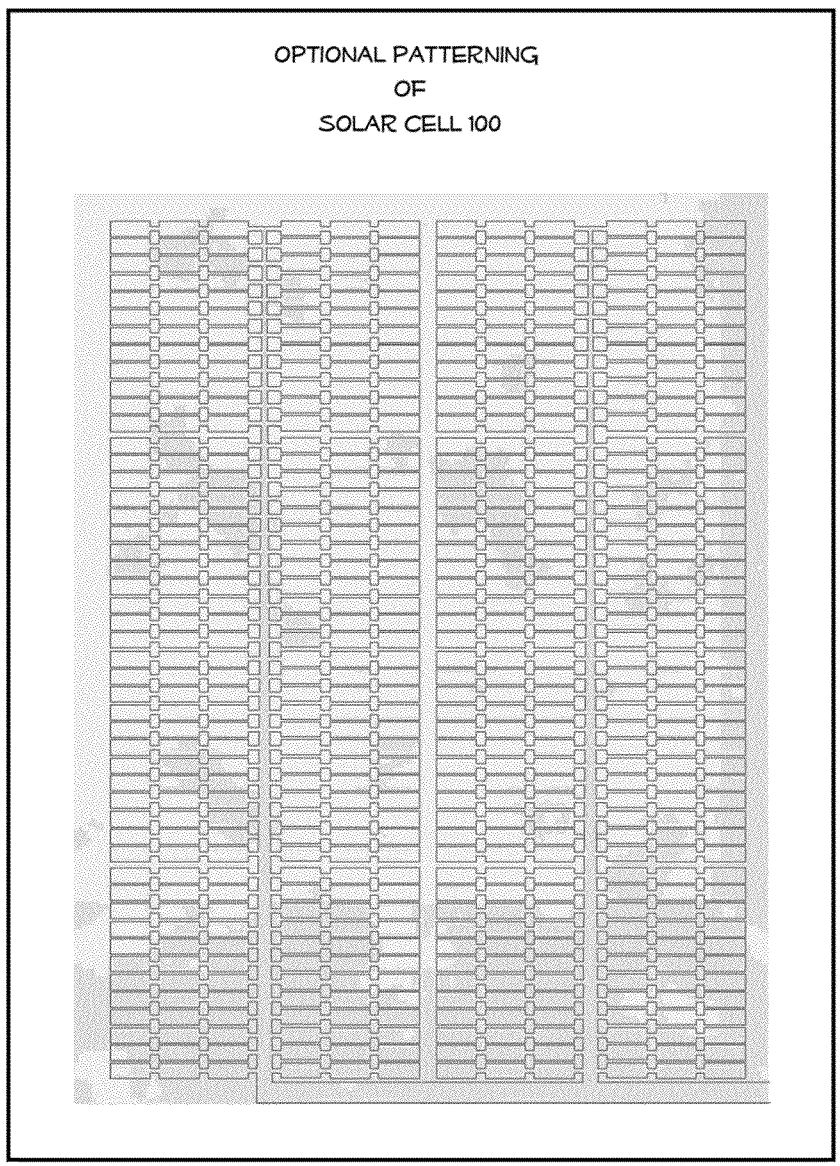
FIG. 3 is an example of an optional patterning of the solar cell.

FIG. 3 shows an example of patterning which may optionally be applied to top conductive layer 150 of solar cell 100 by means of photo lithography dividing the area of solar cell 100 into multiple smaller cells of about 40 sq cm with about 25 to 100 microns between the cells. FIG. 3 includes sample serial and parallel circuitry of the cells and the flow of the electrons to the bottom right corner of solar cell 100.

All numbers expressing dimensions, physical characteristics, quantities of ingredients, reaction conditions, and the like used in the specification and claims are to be understood as being modified in all instances by the term "about".

What is claimed is:

1. A method of fabricating a transparent or semi-transparent solar cell device that incorporates the fabrication of said solar cell into a Float Glass manufacturing process comprising:
   a) forming a first transparent or semi-transparent conductive layer overlying a substrate of hot glass, during a Float Glass process;
   b) a first layer of silicon which has been pre-mixed with a suitable first type dopant material is then deposited at a thickness of less than 4 microns;
   c) a second layer of silicon which has been pre-mixed with a suitable second type dopant material is then deposited at a thickness of less than 4 microns;
   d) the first dopant-silicon layer and the second dopant-silicon layer are then annealed by applying sufficient additional heat to melt the dopant-silicon layers causing subsequent crystallization of the silicon, forming a transparent polycrystalline structure;
   e) then a second layer of transparent or semi-transparent conductive material is applied overlying the polycrystalline structure;
   f) then the second layer of transparent or semi-transparent conductive material is etched or patterned exposing cells and describing serial and parallel circuitry of the cells.

2. The method of claim 1 wherein the first dopant type is p and the second dopant type is n, forming a polycrystalline P-N junction after annealing.

3. The method of claim 1 wherein the first dopant type is n and the second dopant type is p, forming a polycrystalline N-P junction after annealing.

4. A method of fabricating a transparent or semi-transparent solar cell device that incorporates the fabrication of said solar cell into the Float Glass or other high temperature glass manufacturing process comprising:
   a) forming a first transparent or semi-transparent conductive layer overlying a substrate of hot glass, during a Float Glass process;
   b) a first layer of silicon which has been pre-mixed with a suitable first type dopant material is then deposited at a thickness of less than 4 microns;

c) a second layer of un-doped silicon is then deposited at a thickness of less than 4 microns;
d) a third layer of silicon which has been pre-mixed with a suitable second type dopant material is then deposited at a thickness of less than 4 microns;
e) the first, second and third layers of silicon are then annealed by applying sufficient additional heat to melt the silicon layers causing subsequent crystallization of the silicon, forming a transparent polycrystalline structure;
f) then a second layer of transparent or semi-transparent conductive material is applied overlying the polycrystalline structure;
g) then the second layer of transparent or semi-transparent conductive material is etched or patterned exposing cells and describing serial and parallel circuitry of the cells.

5. The method of claim 4 wherein the first dopant type is p and the second dopant type is n, forming a polycrystalline P-N junction after annealing.

6. The method of claim 4 wherein the first dopant type is n and the second dopant type is p, forming a polycrystalline N-P junction after annealing.

7. A method of fabricating a transparent or semi-transparent solar cell device that incorporates the fabrication of said solar cell into the Float Glass or other high temperature glass manufacturing process comprising:
   a) forming a first transparent or semi-transparent conductive layer overlying a substrate of hot glass, during a Float Glass process;
   b) a layer of a suitable first type dopant material is then deposited;
   c) a layer of un-doped silicon is then deposited at a thickness of less than 4 microns;
   d) a layer of a suitable second type dopant material is then deposited;
   e) the layer of first type dopant material, the layer of silicon and the layer of second type dopant material are then annealed by applying sufficient additional heat to melt the silicon layer causing subsequent crystallization of the silicon, forming a transparent polycrystalline structure;
   f) then a second layer of transparent or semi-transparent conductive material is applied overlying the polycrystalline structure;
   g) then the second layer of transparent or semi-transparent conductive material is etched or patterned exposing cells and describing serial and parallel circuitry of the cells.

8. The method of claim 7 wherein the first dopant type is p and the second dopant type is n, forming a polycrystalline P-N junction after annealing.

9. The method of claim 7 wherein the first dopant type is n and the second dopant type is p, forming a polycrystalline N-P junction after annealing.

* * * * *